(12) United States Patent
Ohazama

(10) Patent No.: US 7,327,042 B2
(45) Date of Patent: Feb. 5, 2008

(54) INTERCONNECTION STRUCTURE OF ELECTRIC CONDUCTIVE WIRINGS

(75) Inventor: Hidetaka Ohazama, Yamagata-ken (JP)

(73) Assignee: Tohoku Pioneer Corporation, Yamagata (JP)

( * ) Notice: Subject to any disclaimer, the term of this patent is extended or adjusted under 35 U.S.C. 154(b) by 428 days.

(21) Appl. No.: 10/726,689

(22) Filed: Dec. 4, 2003

(65) Prior Publication Data

US 2004/0108132 A1 Jun. 10, 2004

(30) Foreign Application Priority Data

Dec. 5, 2002 (JP) .............................. 2002-353496

(51) Int. Cl.
- H01L 23/48 (2006.01)
- H01L 23/52 (2006.01)
- H01L 29/40 (2006.01)

(52) U.S. Cl. .................. 257/786; 257/730; 257/773; 257/795; 257/E23.169; 257/E23.175

(58) Field of Classification Search ................ 257/773, 257/776, 737–738, 778–780, 779, 787–790, 257/795, 785, 786, 784, 730–733, E23.169, 257/E23.17, E23.171, E23.172, E23.173, 257/E23.174, E23.175; 438/613, 108, 666, 438/668, 112, 124, 127

See application file for complete search history.

(56) References Cited

U.S. PATENT DOCUMENTS

| | | | |
|---|---|---|---|
| 6,448,663 B1 * | 9/2002 | Uchiyama | .................. 257/778 |
| 2003/0136578 A1 * | 7/2003 | Kishimoto et al. | ......... 174/255 |

FOREIGN PATENT DOCUMENTS

| | | | |
|---|---|---|---|
| JP | 11-017056 | * | 1/1999 |
| JP | 11-212496 | | 8/1999 |
| JP | 2002-258767 | | 9/2002 |

* cited by examiner

*Primary Examiner*—Hoai V. Pham
*Assistant Examiner*—DiLinh Nguyen
(74) *Attorney, Agent, or Firm*—Arent Fox LLP

(57) ABSTRACT

Accumulating spaces for conductive particles are formed in gaps of wiring patterns for conductive wirings which are disposed on a surface of a supporting body. When interconnecting a pair of interconnection objects having the respective wiring patterns via an anisotropic conductive film thereon due to a thermocompression bonding, the conductive particles to be flown-out into the gaps by the thermocompression bonding are allowed to escape into the accumulating spaces, so that an over-density of the conductive particles can be prevented to avoid a shortage in the wiring patterns.

5 Claims, 8 Drawing Sheets

I – I CROSS SECTIONAL VIEW

INTERCONNECTION STRUCTURE OF ELECTRIC CONDUCTIVE WIRINGS

BACKGROUND OF THE INVENTION

The present invention relates to an interconnection structure of electric conductive wiring.

The present application claims priority from Japanese Patent Application Laid-Open No. 2002-353496, the disclosure of which is incorporated herein by reference.

As means for interconnecting respective conductive wiring of a pair of objects to be interconnected (hereinafter referred to as interconnection objects) physically and electrically, there is known an interconnection technology using a thermocompression bonding of interconnection portions of the conductive wiring sandwiching an anisotropic conductive film (ACF) between the respective interconnection portions. The anisotropic conductive film is an adhesive film made of adhesive such as thermoplastic resin or theromo-setting resin containing conductive particles such as metallic particles or metallic coating plastic particles, anisotropic conductivity of which is assigned by scattering the conductive particles into the adhesive. The film enables an electric interconnection of a fine wiring pattern only through a thermocompression bonding process. Consequently, the film has been widely available in an interconnection of panel electrodes of a flat-panel such as LCD or organic EL and a Flexible Printed Circuit (FPC), or a Tape Automated Bonding (TAB) tape or the like (see, for example, Japanese Patent Application Laid-Open No. 2002-258767, or Japanese Patent Application Laid-Open No. Japanese Patent Application Laid-Open No. Hei.11-212496).

FIGS. 1A and 1B are explanatory views illustrating a conventional interconnection structure of the conductive wiring using such an anisotropic conductive film. In more detail, FIG. 1A is a cross-sectional view sectioned by a plane perpendicular to the conductive wiring, and FIG. 1B is a cross-sectional view sectioned along an I-I line shown in the FIG. 1A. The interconnection structure is formed through a thermocompression bonding between a conductive wiring 122 formed on a surface of a supporting body 121 as one interconnection object and a conductive wiring 132 formed on a surface of a supporting body 131 as the other interconnection object, sandwiching an anisotropic conductive film 140, which contains conductive particles 142, between these two conductive wirings. The conductive wirings 122 and 132 are electrically connected with each other through conductive particles 142 after the compression bonding is achieved. Because the conductive particles 142 are scattered in an insulating adhesive at the non-existing regions 146 of the conductive wirings (gaps between the conductive wiring patterns), an insulating state thereof is held between adjacent conductive wirings. Hence, through only the thermocompression bonding, it is possible for the conductive wirings 122 and 132 to be connected electrically with each other according to the respective wiring patterns as well as an adhesion of the interconnection objects.

In the conventional interconnection structure of conductive wiring using the anisotropic conductive film as shown in FIG. 1B, the adhesive, which serves as a base material of the anisotropic conductive film 140, becomes fluid at the time of the thermocompression bonding. As a result, there occurs a phenomenon that a part of the conductive particles 142 maintained in the adhesive between conductive wirings 122 and 132 is pushed out into each gap 146 between adjacent conductive wirings.

Because the conductive wirings of electronic apparatus have been recently desired to be more high-density, wiring patterns with narrow pitches are adopted in their interconnection structures of conductive wiring. Hence, the density of the conductive particles 142 becomes over-dense in the narrow gap 146, when the fluidization of the adhesive is blocked locally.

As shown in FIG. 1B, for instance, when an insulating layer 133 covers a surface on which the conductive wiring of an interconnection object is formed, there may occur a phenomenon that an edge of the insulating layer 133 facing on the interconnection portion blocks a flow of the adhesive in anisotropic conductive film 140. Thereby, the conductive particles 142 may stay over-densely in the gap 146 near the edge of the insulating layer 133. This may cause a shortage between adjacent conductive wirings, so called "shortage in wiring pattern".

As further shown in FIG. 1B, suppose that an interconnection object having a supporting body 131 a surface of which is covered with the insulating layer 133 except for the surface of the interconnection portion, is interconnected with the other interconnection object at the end of the supporting body 121. When the supporting body 131 is bent, a maximum bending moment is applied on the supporting body 131 at a location of the end of the insulating layer 133, and causes a stress concentration at the end of the insulating layer 133. This causes the other problem that a destruction of the interconnection object may occur at the portion of the stress concentration, if an excess bending is applied thereon.

On the contrary, when the insulating layer 133 of the supporting body 131 is overlapped on the other supporting body 121 to be interconnected with each other, a flow of the adhesive in the anisotropic conductive film 140 is blocked completely at the end of the insulating layer 133. Thus, the problem of the shortage in the wiring patterns more often occurs than one as described previously.

SUMMARY OF THE INVENTION

The object of the present invention is to cope with these problems. More specifically, it is the respective objects of the present invention to avoid the shortage in the wiring pattern due to the movement of conductive particles into the gaps between the adjacent conductive wiring, and to prevent the destruction of the interconnection portion due to the bending of the interconnection object, as mentioned above.

To achieve these objects, the present invention has at least characteristics as follows.

A first aspect of the present invention is characterized by an interconnection structure of conductive wirings for interconnecting a pair of interconnection objects by a thermocompression bonding, in which the conductive wirings are disposed on the interconnection objects, respectively, comprising interconnection portions formed of conductive wiring patterns on a surface of each supporting body of the interconnection objects, the interconnection portions being provided with gaps between adjacent ones, an anisotropic conductive film containing conductive particles therein, the film being interposed between the interconnection portions disposed on the respective interconnection objects, and an accumulating space formed in the respective gaps between the conductive wiring patterns in order to prevent an over-density of the conductive particles flown out from the interconnection portions to the gaps due to the thermocompression bonding from occurring.

A second aspect of the present invention is characterized by an organic EL display panel having a substrate, and interconnection portions including conductive wiring patterns formed on the substrate, in which the interconnection portions are connected with an interconnection object via an anisotropic conductive film by a thermocompression bonding, comprising a concave portion formed in respective gaps between the conductive wiring patterns on the substrate, wherein the concave portion receives conductive particles flown out from the anisotropic conductive film due to the thermocompression bonding.

A third aspect of the present invention is characterized by a flexible printed-wiring board having interconnection portions including conductive wiring patterns formed on a surface thereof, in which the interconnection portions are connected with an interconnection object via an anisotropic conductive film by a thermocompression bonding, comprising insulating layers covered on the surface except for the interconnection portions, and a retreated concave portion formed at each edge of the insulating layers adjacent to the interconnection portions, wherein the retreated concave portion receives conductive particles flown out from the anisotropic conductive film due to the thermocompression bonding.

A forth aspect of the present invention is characterized by an interconnecting method of conductive wirings for interconnecting a pair of interconnection objects via an anisotropic conductive film including conductive particles by a thermocompression bonding, in which the conductive wirings are disposed on the interconnection objects, respectively, comprising the steps of forming an accumulating space for the conductive particles in respective gaps between conductive wiring patterns, and accumulating the conductive particles flown out from the anisotropic conductive film due to the thermocompression bonding in the accumulating space, so that an over-density of the conductive particles in the gaps can be prevented.

BRIEF DESCRIPTION OF THE DRAWINGS

These and other objects and advantages of the present invention will become clear from the following description with reference to the accompanying drawings, wherein:

FIGS. 1A and 1B are cross-sections illustrating a conventional interconnection structure of conductive wirings, in which FIG. 1A is a cross-sectional view sectioned by a plane perpendicular to the conductive wirings, and FIG. 1B is a cross-sectional view sectioned by I-I line shown in the FIG. 1A;

DETAILED DESCRIPTION OF THE PREFERRED EMBODIMENTS

Figure 1:
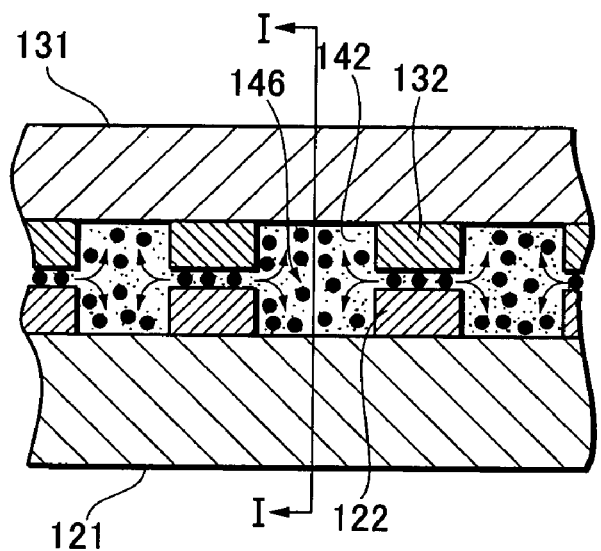
Figure 1:
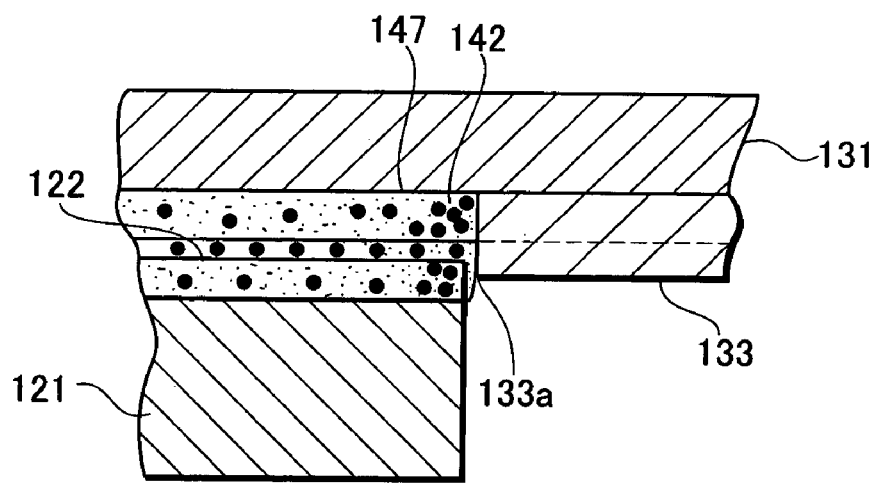

An interconnection structure of conductive wiring or a method for interconnecting the wiring according to embodiments of the present invention has characteristics as follows.

A first characteristic is in the interconnection structure of conductive wirings for interconnecting a pair of interconnection objects, each of which has a supporting body forming a wiring pattern of conductive wiring thereon by using a thermocompression bonding of a pair of the electrically conductive wirings via an anisotropic conductive film containing conductive particles, wherein accumulating spaces are formed in gaps between wiring patterns of conductive wirings to prevent an over-density of the conductive particles due to a movement of the conductive particles caused from the thermocompression bonding.

Furthermore, from a viewpoint of method, in an interconnection method of conductive wirings for interconnecting a pair of interconnection objects, each of which has a supporting body forming a wiring pattern of conductive wiring thereon by using a thermocompression bonding of a pair of the electrically conductive wirings via an anisotropic conductive film containing conductive particles, accumulating spaces are formed in gaps between wiring patterns of conductive wirings to make the flown-out conductive particles escape therein, so that an over-density of the conductive particles caused by the thermocompression bonding can be prevented When the thermocompression bonding is performed for interconnecting the interconnection objects, the conductive particles contained in the anisotropic conductive film crowd together at gaps of wiring patterns. Under this situation, however, the present invention allows the conductive particles to be accumulated in the accumulating spaces formed at the gaps between the wiring patterns, so that a shortage in a wiring pattern due to an over-density of the conductive particles at the gap of a wiring pattern can be avoided. The characteristics are effective particularly to the interconnection of the conductive wirings having wiring patterns with a narrow pitch.

A second characteristic is that, in addition to the first characteristic, concave portions or hole portions are formed to serve as the accumulating spaces on at least one of the supporting body surface of interconnection objects. According to such a characteristic, the concave portions or hole portions are formed in the gaps between the wiring patterns to perform the function of the accumulating spaces.

A third characteristic is that, in addition to the first characteristic, insulating layers cover the supporting body of one or both of the interconnection objects except for the interconnection portion, and the accumulating space comprises retreated concave portion formed at an edge of the insulating layer adjacent to the interconnection portion.

Such characteristics enables a shortage in a wiring pattern at the other portions except for the interconnection portion to be avoided, because the insulating layer covers the surface of the supporting body of an interconnection object except for the surface of the interconnection portion. At the interconnection portion, the retreated concave portions are formed as the accumulating spaces at the edge of the insulating layer, so that a shortage in the wiring pattern due to the flow-out conductive particles at the time of the theromocompression bonding can be prevented. Furthermore, because the retreated concave portions as the accumulating spaces are formed at the edge of the insulating layer, the accumulating spaces can be formed easily without a processing of the supporting body itself of the interconnection object.

A forth characteristic is that, in addition to the above-mentioned characteristics, the insulating layers cover the supporting body of one or both of the interconnection objects except for the interconnection portion, and the edges of the insulating layers adjacent to the interconnection portions are included in a region of the thermocompression bonding. In other words, the supporting body including the edge of the insulating layer is glued and fixed in the region of the thermocompression bonding. So even if an external force such as an excess bending force is applied to the interconnection object, a destruction of the interconnection object can be prevented because the interconnection object is covered with the insulating layer 33 strengthening its strength in thickness and avoid a stress concentration at the edge of the region of the thermocompression bonding.

A fifth characteristic is that, in addition to the above-mentioned characteristics, one of the pair of interconnection objects is a printed circuit board or a TAB tape. Although narrow pitches in the wiring pattern have been recently adopted in the field of printed circuit board or the TAB tape, it becomes surely possible to avoid a shortage in the wiring pattern of the interconnection portions or to avoid a destruction at the edge of the theromocompression bonding according to the present invention, so that products with high-reliability can be obtained.

A sixth characteristic is that, in addition to the above-mentioned characteristics, one of the pair of interconnection objects is an interconnection portion of a display panel board. Further, a seventh characteristic is that the display panel board is a panel board formed of organic EL elements. These characteristics allow a shortage in a wiring pattern and destruction at the edge of the region of the theromocompression bonding to be avoided. Consequently, it becomes possible to obtain a high-quality display panel board, even if an interconnection portion of the display panel board has a wiring pattern with a narrow pitch.

In other words, because a conductive wiring with a narrow pitch is able to interconnect the wiring pattern of the interconnection object with a reliable insulation of each conductive wiring, it becomes possible to uniform the resistance of each conductive wiring of the interconnection portions. Thus, the uniform driving can be applied to the pixels formed of an organic EL element, so that an organic EL display panel can be obtained with a high quality.

Hereinafter, further detailed descriptions will be given with respect to the interconnection structures of conductive wiring and methods of interconnection according to embodiments having the above-mentioned characteristics, referring to drawings.

Figure 2:
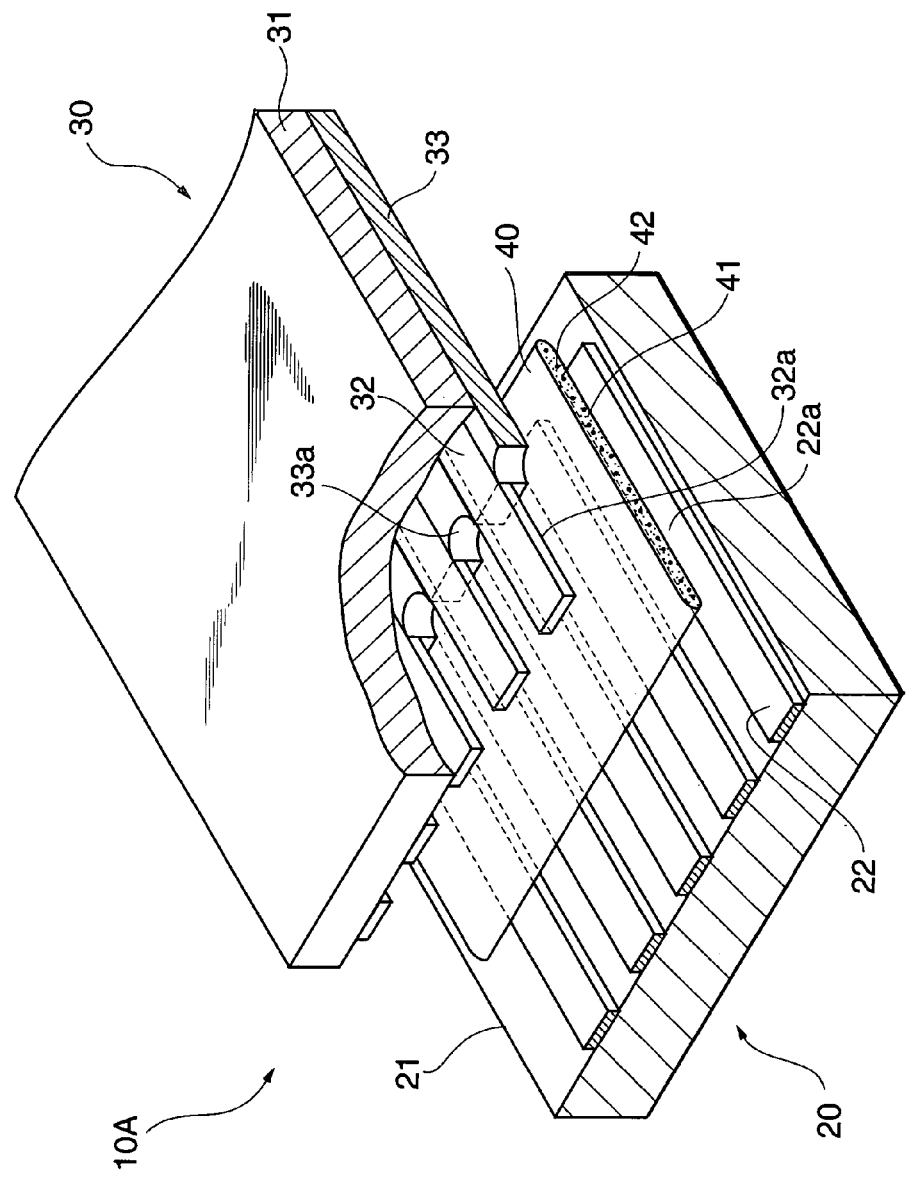
FIG. 2 is a perspective view for illustrating an interconnection structure of conductive wirings according to a first embodiment of the present invention.

FIG. 2 is a perspective view illustrating compositions of an interconnection structure 10A of conductive wirings according to the first embodiment. As shown in FIG. 2, a wiring pattern of conductive wiring 22 is formed on a surface of a supporting body 21 of a first interconnection object 20. A first interconnection portion 22a is formed by gathering the respective ends of conductive wirings 22 at a peripheral portion of the first interconnection object 20.

A wiring pattern of conductive wiring 32 is also formed on a surface of a supporting body 31 of a second interconnection object 30, and is partially covered with an insulating layer 33. The part of conductive wiring 32 not covered with the insulating layer 33 is arranged on the supporting body 31, and forms a second interconnection portion 32a.

Retreated concave portions 33a are formed at the wiring pattern gaps as disposed between the adjacent conductive wirings 32 and at the edge of the insulating layer 33 facing the interconnection portion 32a.

An anisotropic conductive film 40 is interposed between the interconnection portion 22a and the interconnection portion 32a. The anisotropic conductive film 40 is an adhesive film in which conductive particles 42 are held dispersively in an adhesive 41.

Figure 3:
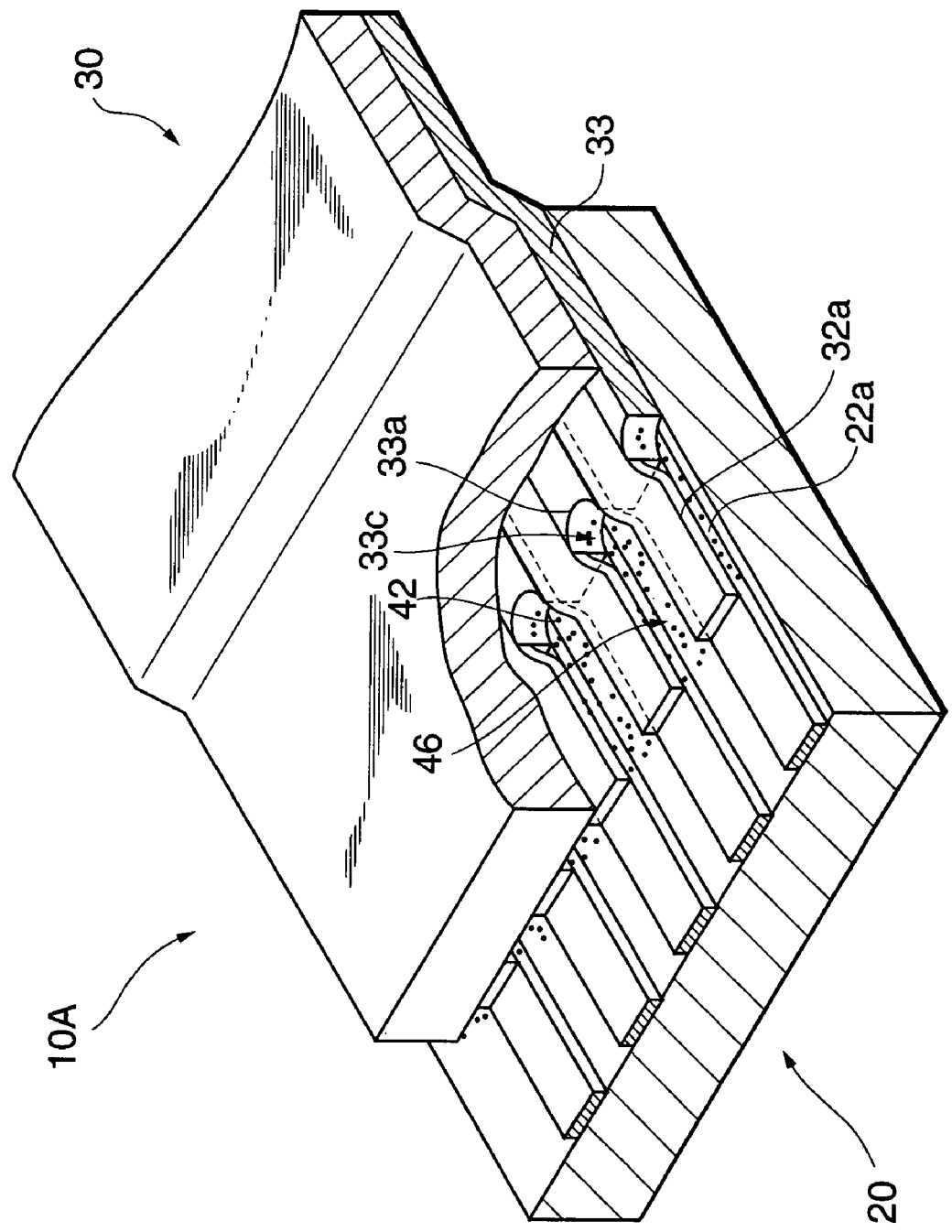
FIG. 3 is a perspective view for more detailedly illustrating the interconnection structure of conductive wirings according to the first embodiment.

FIG. 3 is a perspective view illustrating a state of an interconnection between the interconnection objects 20, 30, with the interconnection structure 10A of conductive wiring according to the embodiment of the present invention.

The interconnection structure 10A is realized by applying a thermocompression bonging to both the interconnection portion 22a of the first interconnection object 20 and the interconnection portion 32a of the second interconnection object 30, with the anisotropic conductive film 40 interposed therebetween. An electric connection between the interconnection portions 22a and 32a is accomplished by the thermocompression bonding, because the conductive particles 42 contained in the anisotropic conductive film 40 make electric contacts between the two interconnection portions. On the other hand, gaps 46 as disposed between the wiring patterns maintain an insulating property thereof, because the conductive particles 42 are dispersively held in the adhesive of the anisotropic conductive film 40. Of course, when the adhesive in the anisotropic conductive film is solidified, the interconnection objects 20, 30 are firmly adhered.

When the thermocompression bonding is executed, the adhesive in the anisotropic conductive film is fluidized. As a result, there occurs a phenomenon that a part of the conductive particles 42 held between the interconnection portions 22a, 32a is pushed out into the adjacent wiring pattern gaps 46.

In order to cope with the phenomenon, the abovementioned retreated concave portions 33a are formed to serve as accumulating spaces 33 for escaping the conductive particles 42, at the edges of the insulating layer 33 covering the interconnection object 30. Hence, a part of the conductive particles 42 pushed out into the wiring pattern gaps 46 results in flowing into the accumulating spaces 33c.

Figure 4:
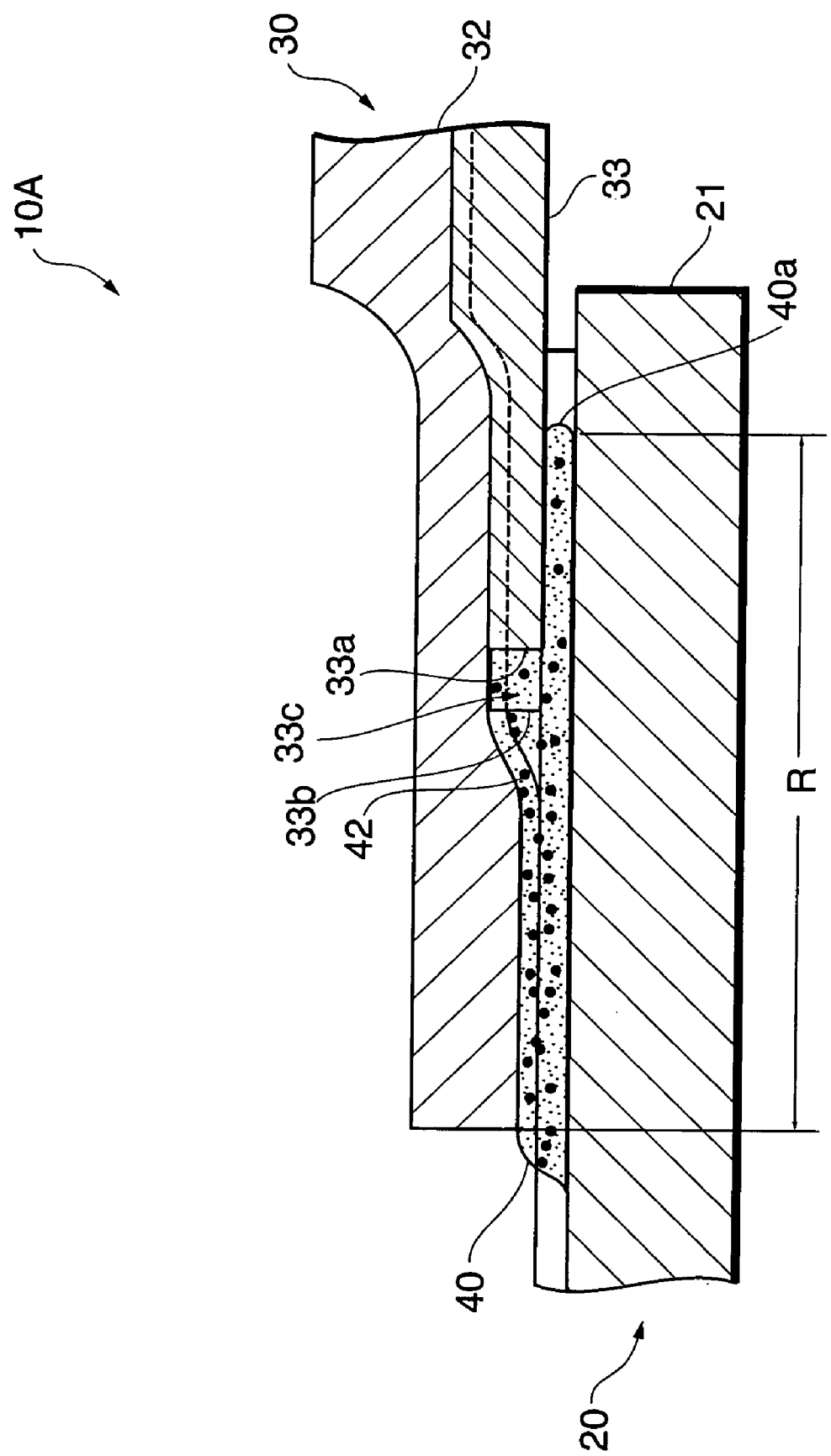
FIG. 4 is a cross-sectional view sectioned along a longitudinal direction of a wiring pattern gap for illustrating the interconnection structure of the conductive wirings according to the first embodiment.

FIG. 4 is a cross sectional view sectioned along the wiring pattern gap 46 for illustrating the interconnection structure 10A of conductive wiring according to the present embodiment. An interconnection object 30 is interconnected to the other interconnection object 20 under the state that an edge of the insulating layer 33 of the interconnection object 30 is overlapped on the interconnection object 20 at a region R of the thermocompression bonding via an anisotropic conductive film 40, as shown in FIG. 4.

In such an interconnection structure 10A according to the present embodiment, retreated concave portions 33a are formed to serve as accumulating spaces 33c for the conductive particles 42, at the edge of the insulating layer 33 covering the interconnection object 30. Hence, the conductive particles 42, which are pushed out into the wiring pattern gaps 46 at the time of the thermocompression bonding, escape into the accumulating spaces 33c. This results in preventing an over-density of the conductive particles 42 in the wiring pattern gaps 46 from occurring, and thus avoiding a shortage between the wiring patterns.

The accumulating spaces 33c prevent the over-density of the conductive particles 42 from occurring in the wiring pattern gaps 46 due to being blocked against the edge of the insulating layer 33. Hence, even when the interconnection objects are interconnected under the state that the edge of the insulating layer 33 is overlapped on the region R of thermocompression bonding, the shortage between the wiring patterns due to the over-density of the conductive particles will not occur.

In such an interconnection, even if an external force such as an excess bending force is applied to the interconnection object 30, a breaking of the interconnection object 30 can be prevented because the interconnection object 30 is covered with the insulating layer 33 strengthening its strength in thickness to avoid a stress concentration at the edge 40a of the region R of the thermocompression bonding.

Figure 5:
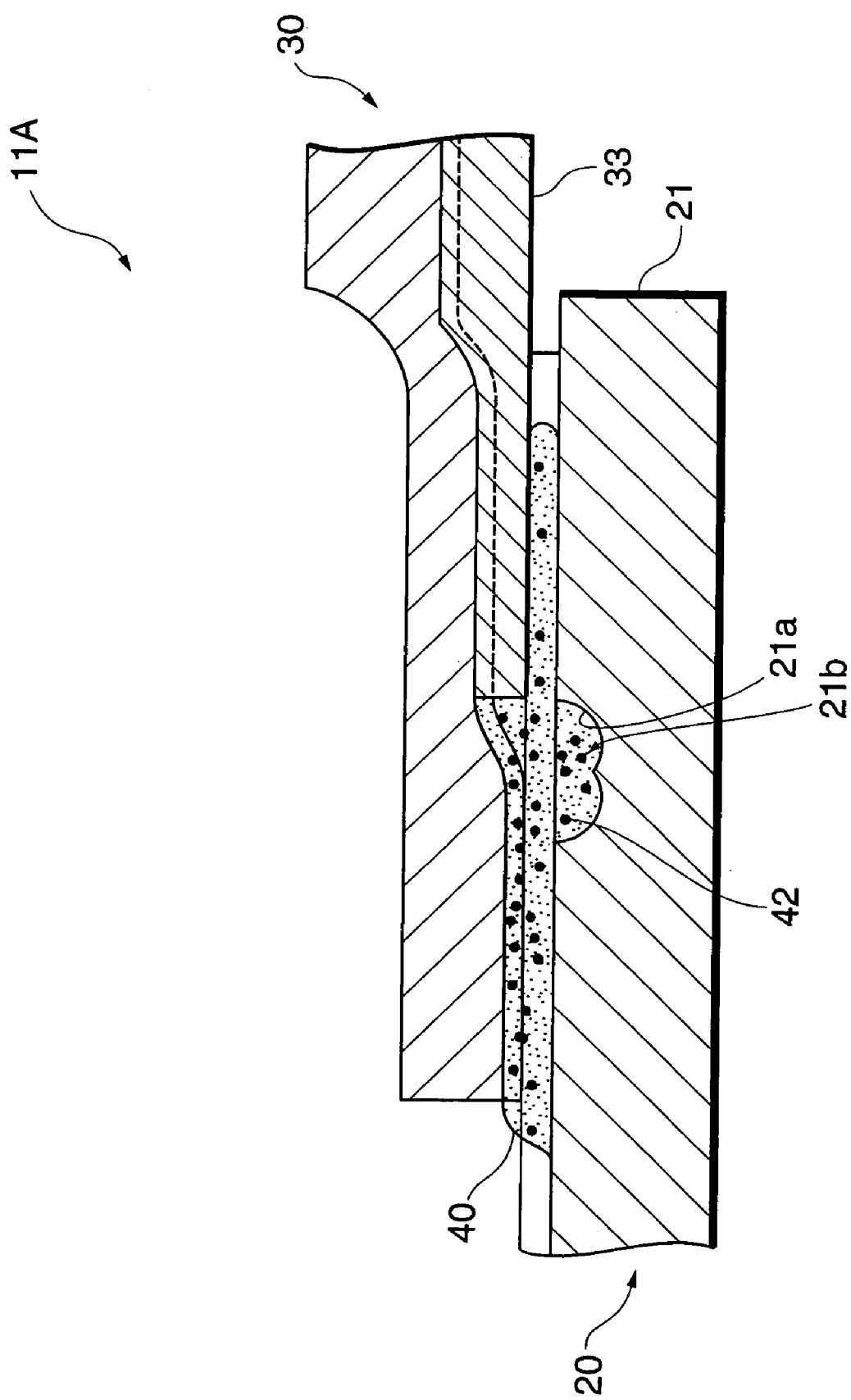
FIG. 5 is a cross-sectional view for illustrating an interconnection structure of conductive wirings according to a second embodiment.

Next, a description will be given with respect to an interconnection structure 11A of wiring patterns according to a second embodiment which is a modification of the first embodiment, referring to FIG. 5. In this drawing, each part which is common to that of the first embodiment will be denoted by the same symbol. FIG. 5 is a cross sectional view sectioned along the gap 46 of the wiring pattern.

In the interconnection structure 11A, groove-shaped concave portions 21a are formed to serve as accumulating spaces 21b for the conductive particles 42 near the edge of the insulating layer 33 in gaps of the wiring pattern on the supporting body 21 of the first interconnection object 20.

In such an interconnection structure 11A of the present embodiment, the accumulating spaces 21b are formed in the gaps of the wiring patterns on the supporting body 21 of the interconnection object 20. Hence, the conductive particles 42, which are pushed out into the wiring pattern gaps 46 at the time of the thermocompression bonding, escape into the accumulating spaces 21b. This results in preventing the over-density of the conductive particles 42 from occurring in the wiring pattern gaps, thus avoiding a shortage between the wiring patterns.

Figure 6:
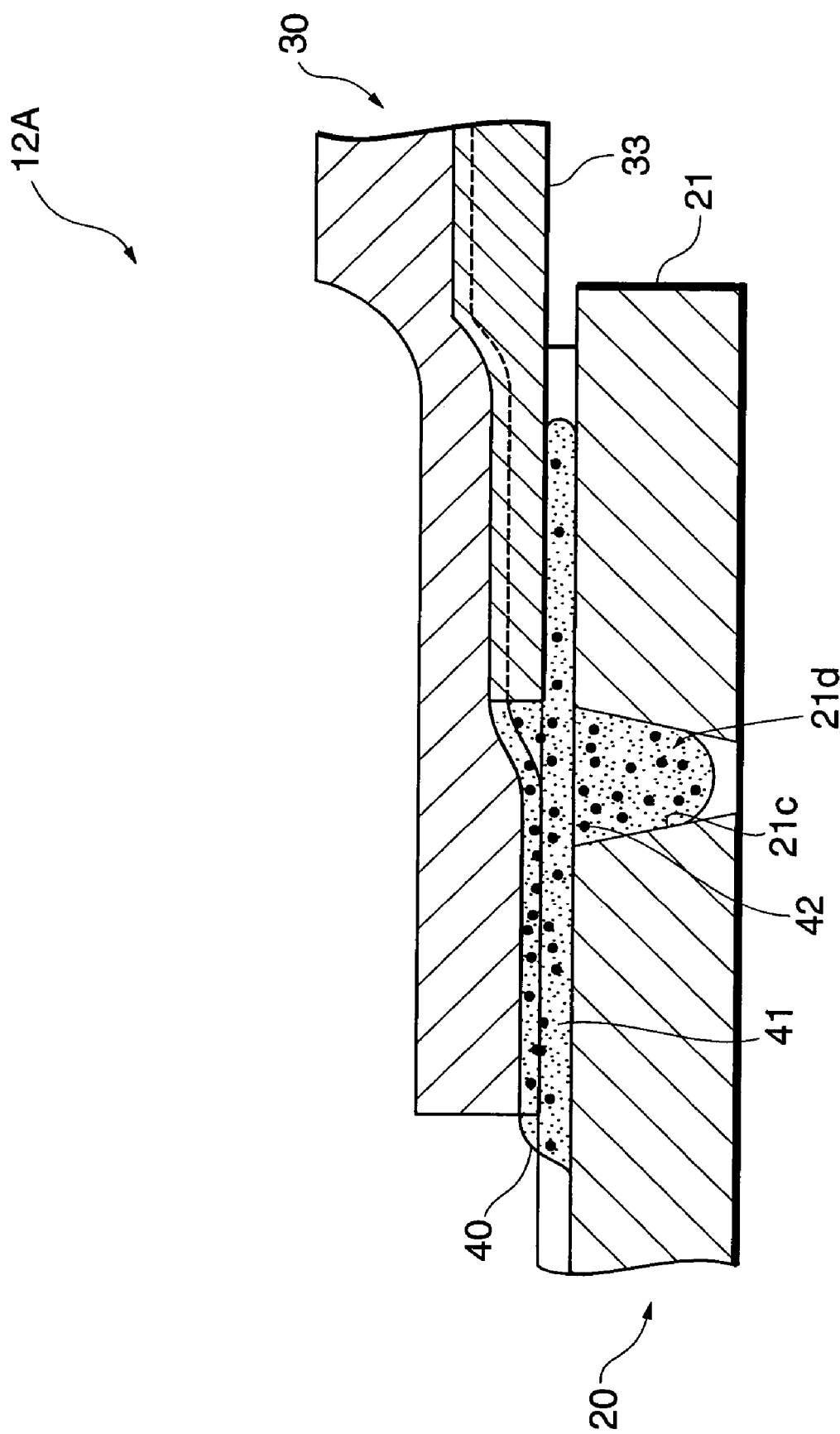
FIG. 6 is a cross-sectional view for illustrating an interconnection structure of conductive wirings according to a third embodiment.

Next, a description will be given with respect to an interconnection structure 12A of wiring patterns according to a third embodiment, which is another modification of the first embodiment, referring to FIG. 6. In this drawing, each part which is common to that of the first embodiment will be denoted by the same symbol. FIG. 6 is a cross sectional view sectioned along the gap 46 of the wiring pattern.

In the interconnection structure 12A, hole portions 21c penetrating the supporting body 21 are formed to serve as accumulating spaces 21d for conductive particles 42 near the edge of the insulating layer 33 in gaps between wiring patterns on the supporting body 21 of the first interconnection object 20.

In such an interconnection structure 12A of the present embodiment, the accumulating spaces 21d are formed in the gaps between the wiring patterns on the supporting body 21 of the interconnection object 20. Hence, the conductive particles 42, which are pushed out into the wiring pattern gaps 46 at the time of the thermocompression bonding, escape into the accumulating spaces 21d. This results in preventing the over-density of the conductive particles 42 from occurring in the wiring pattern gaps, and thus avoiding a shortage between the wiring patterns.

Figure 7:
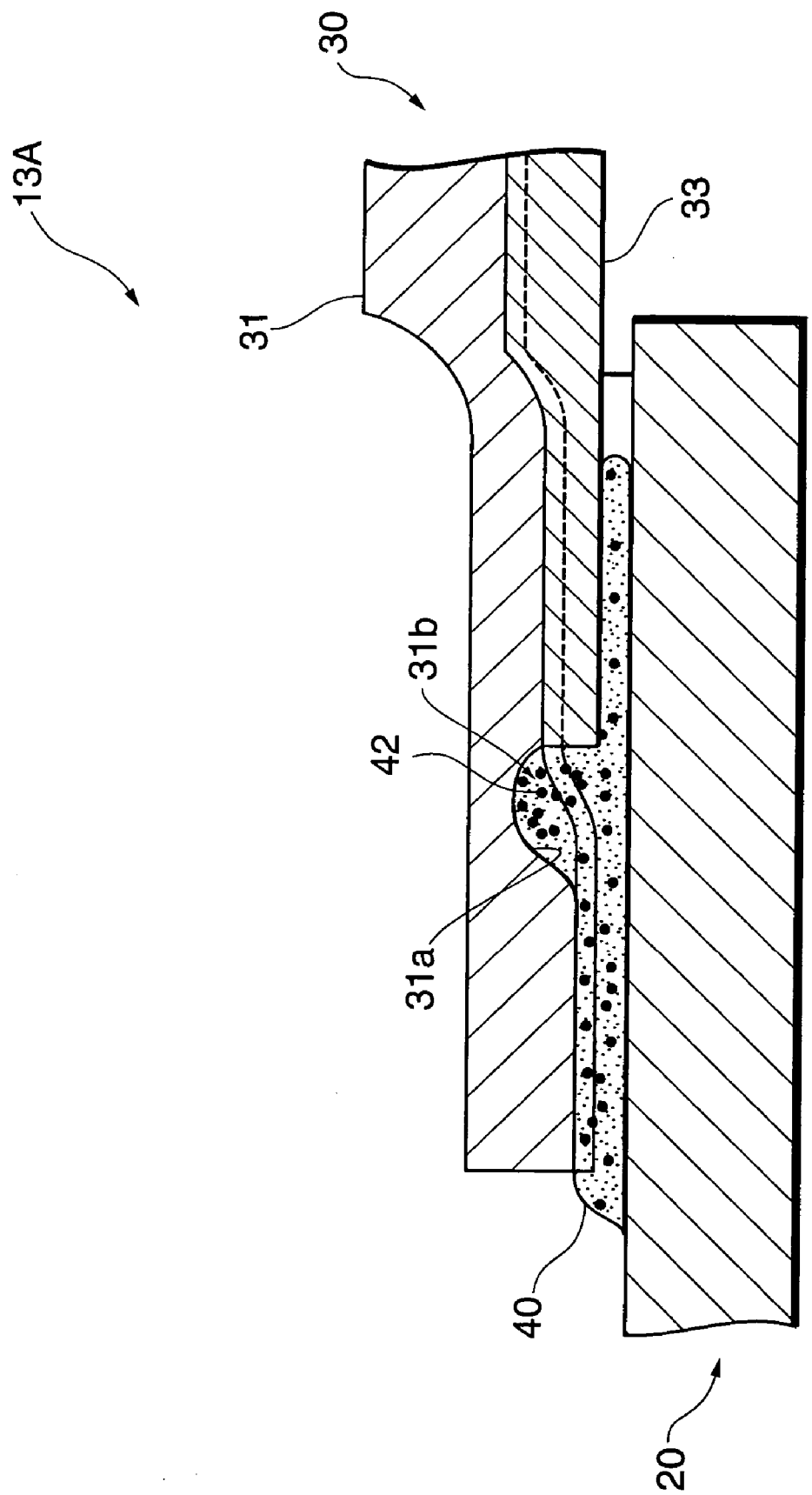
FIG. 7 is a cross-sectional view for illustrating an interconnection structure of conductive wirings according to a forth embodiment.

Next, a description will be given with respect to an interconnection structure 13A of wiring patterns according to a fourth embodiment, which is the other modification of the first embodiment, referring to FIG. 7. In this drawing, each part which is common to that of the first embodiment will be denoted by the same symbol. FIG. 7 is a cross sectional view sectioned along the gap 46 of the wiring pattern.

In the interconnection structure 13A, groove-shaped concave portions or hole portions 31a penetrating the supporting body 31 (not shown) are formed to serve as accumulating spaces 31b for conductive particles 42 near the edge of the insulating layer 33 in gaps between the wiring patterns on the supporting body 31 of the second interconnection object 30.

In such an interconnection structure 13A of the present embodiment, the accumulating spaces 31b are formed in the gaps between the wiring patterns on the supporting body 31 of the interconnection object 30. Hence, the conductive particles 42, which are pushed out into the wiring pattern gaps 46 at the time of the thermocompression bonding, escape into the accumulating spaces 31b. This results in preventing the over-density of the conductive particles 42 from occurring in the wiring pattern gaps, and thus avoiding a shortage between the wiring patterns.

EXAMPLES OF EMBODIMENT

An example of embodiment of the present invention will be hereinafter explained, in which a pair of interconnection objects mentioned above is an organic EL display panel and a flexible printed circuit, respectively.

The characteristic of the example of embodiment is as follows: an organic EL display panel which provides an interconnection portion formed of a wiring pattern of conductive wiring on a substrate, is interconnected with an interconnection object at the interconnection portion via an anisotropic conductive film by using a thermocompression bonding; and furthermore concave portions or hole portions are formed in gaps between the wiring patterns of the interconnection portion, to accumulate the conductive particles flown out from the anisotropic conductive film due to the thermocompression bonding.

In such an organic EL display panel, an interconnection of the other interconnection object to its interconnection portion through the thermocompression bonding, causes that the conductive particles in the anisotropic conductive film move out to accumulate in the wiring pattern gaps. Because the concave portions or the hole portions are formed on the substrate surface of the interconnection portion, the conductive particles, which are pushed out into the wiring pattern gaps at the time of the thermocompression bonding, can escape into the concave or hole portions. This results in preventing an over-density of the conductive particles from occurring in the wiring pattern gaps, so as to avoid a shortage between the wiring patterns.

Thus, the conductive wiring with a narrow pitch on the organic EL display panel can be interconnected with the wiring pattern of the interconnection object with a reliable insulation of each conductive wiring. As a result, electric resistances of the conductive wirings in the interconnection portion become uniform, and each pixel formed of an organic EL element can be driven uniformly. This leads manufacturing the organic EL display panel with good display qualities.

The flexible printed circuit provides an interconnection portion which has a conductive wiring pattern formed on its surface, and is thermocompression-bonded to the interconnection object via the anisotropic film. The surface of the flexible printed circuit is covered with an insulating layer except for the interconnection portion. Retreated concave portions are formed to serve as the accumulating spaces for the conductive particles moved through the thermocompression bonding, at the edge of the insulating layer adjacent to the interconnection portion.

In such a flexible printed circuit, even when the conductive particles in the anisotropic conductive film are pushed out into the wiring pattern gaps at the time of the thermocompression bonding, they can be transferred into the retreated concave portions serving as the accumulating spaces, at the edge of the insulating layer. This results in preventing the over-density of the conductive particles from occurring in the wiring pattern gaps, and thus avoiding a shortage between the wiring patterns. Because the retreated concave portions are formed on the insulating layer of the flexible printed circuit, the accumulating spaces for the conductive particles can be effectively formed without an extra processing of the supporting body of the flexible printed circuit or the interconnection object.

Such an example of the present embodiment will be explained more detailedly referring to FIG. 8. In this drawing, each part which is common to that of the above-mentioned embodiment will be denoted by the same symbol.

Figure 8:
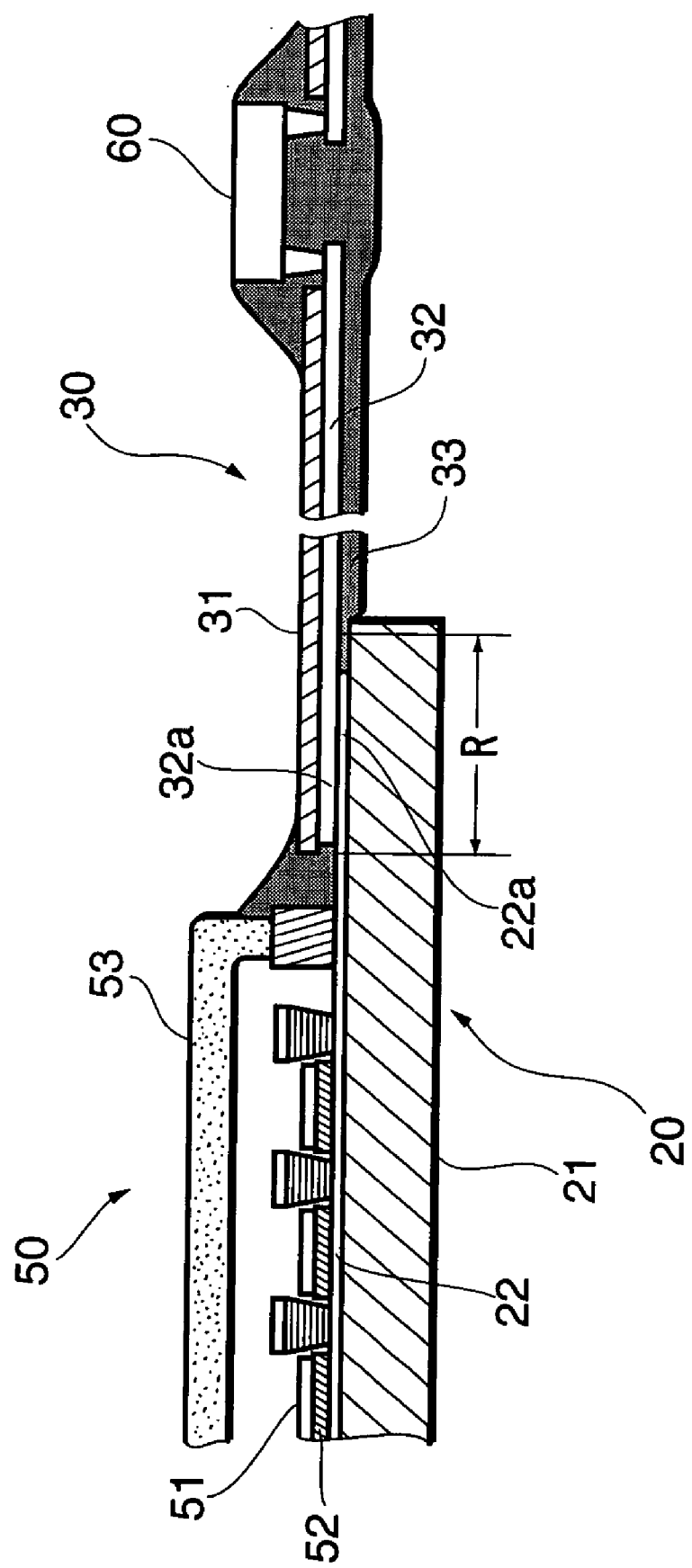
FIG. 8 is a cross-sectional view for illustrating an interconnection structure of conductive wirings adapted to a display panel substrate and a printed-wiring board.

FIG. 8 is a cross-sectional view for illustrating an interconnection structure between leading electrodes 22a for driving a display panel board 20 of organic EL elements 50 and electrodes 32a formed on the printed wiring of a flexible printed circuit 30 (hereinafter referred to as "flexible board").

The organic EL element 50 provides anodes 22 formed of transparent electrodes of ITO (Indium Tin Oxygen) or the like, which are arranged in the parallel direction each other with a specific space on a substrate 21 formed of transparent glass or the like.

Each Organic EL layer 52 is formed in the direction perpendicular to the direction of the anode 22 thereon. On the organic EL layer 52, each metallic electrode such as aluminum (Al) is formed in the direction parallel to the organic EL layer 52 as a cathode 51.

Each organic EL layer 52 is sandwiched at the cross portion of the anode 22 and the cathode 51, and serves as a light emitting portion for emitting light through injecting an electric current. The light emitting portions are arranged in a matrix form on the display panel board 20. Such a light emitting portion formed of an organic EL element is sealed with a sealing member 53 of material such as metal or glass for preventing moisture.

The electrodes 22a serving as terminals of the anodes 22 are gathered at a peripheral region of the display panel board 20, and, for example, the electrode with a linear shape of 25 μm width is arranged in parallel with a space of 25 μm each other.

A flexible board 30 provides an insulating thin board 31, serving as a flexible supporting body, and on the surface of the insulating thin board 31 a wiring pattern formed of a conductive body 32 such as thin copper film is printed. The insulating thin board 31 printing the conductive body 32 on its surface is covered with an insulating resist layer 33. At the edge of the flexible board 30, the terminals of conductive body 32, which are not covered with the resist layer 33, are formed as electrodes 32a. The electrodes 32a of the flexible board 30 have an arrangement and a shape corresponding to those of the electrodes 22a of the display panel board 20.

A LSI chip 60 may be directly mounted on the flexible board 30 for driving organic EL elements 50 through a TCP (Tape Carrier Package). In this case, the LSI chip 60 is connected to the conductive body 32 through TAB (Tape automated Bonding) technique.

In the present example of embodiment, a pair of interconnection objects is the display panel board 20 and the flexible board 30, respectively, and the electrodes 22a and 32a of the above-mentioned boards 20 and 30 are interconnected sandwiching the anisotropic conductive film 40 therebetween through the thermocompression bonding for several ten seconds and at the temperature of about 200° C., for instance.

An electric connection is achieved through the conductive particles 42 contained in the anisotropic conductive film 40 between the compression-bonded electrodes 22a and 32a.

Retreated concave portions 33a as shown in FIG. 4 are formed at the wiring pattern gaps near the edge of the resist layer 33 covering the flexible board 30. The flexible board 30 is interconnected to the display panel board 20, under the state that the edge of the resist layer 33 is overlapped on the region R of the thermocompression bonding via the anisotropic conductive film 40.

In such an interconnection structure according to this embodiment, the retreated concave portions 33a are formed to serve as the accumulating spaces 33c for the conductive particles 42, at the edge of the resist layer 33 of the flexible board 30. Hence, the conductive particles 42, which are pushed out into the wiring pattern gaps 46 at the time of the thermocompression bonding, escape into the accumulating spaces 33c. This results in preventing the over-density of the conductive particles 42 from occurring in the wiring pattern gaps 46, and avoiding a shortage between the wiring patterns.

In other words, the accumulating spaces 33c prevent the over-density of the conductive particles 42 from occurring in the wiring pattern gaps 46 due to being blocked against the edge of the resist layer 33. Hence, even when the interconnection objects are interconnected under the state that the edge of the resist layer 33 is overlapped on the region R of a thermocompression bonding, a shortage between the wiring patterns due to the over-density of the conductive particles will not occur. In such an interconnection, even if an external force such as an excess bending force is applied to the flexible board 30, a breakage of the flexible board 30 can be prevented because the interconnection object 30 is covered with the resist layer 33 strengthening its strength in thickness to avoid a stress concentration at the edge 40a of the region R where the thermocompression bonding is performed, and also the maximum bending moment occurs.

The above-mentioned accumulating space may be formed as the groove-shaped concave portion 21a formed on the supporting substrate 21 of the display panel board 20 or the hole portion 21c penetrating the supporting substrate 21 near the edge of the resist layer 33 in the wiring pattern gap as shown in FIG. 5 and FIG. 6.

Further, the above-mentioned accumulating space may be also formed as the groove-shaped concave portion 31a formed on the insulating thin board 31 of the flexible board 30 or a hole portion (not shown) penetrating the insulating thin board 31 near the edge of the resist layer 33 in the wiring pattern gap as shown in FIG. 7.

The above-mentioned flexible board (flexible printed circuit) includes also a COF (Chip on Film) mounting LSI chips for driving.

The formation of the accumulating space as mentioned above results in preventing the over-density of the conductive particles from occurring in the wiring pattern gaps to avoid the shortage between the wiring patterns. Thus, for the conductive wirings with a narrow pitch wiring pattern, it is possible to interconnect the wiring patterns of the interconnection objects with each conductive wiring to be surely insulated. As a result, an electric resistance of each conductive wiring in the interconnection portion becomes uniform, so that each pixel formed of an organic EL element can be driven uniformly. This leads a manufacture of an organic EL display panel with good display qualities.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A flexible printed-wiring board having interconnection portions including conductive wiring patterns formed on a surface thereof, in which the interconnection portions are connected with an interconnection object via an anisotropic conductive film by a thermocompression bonding, comprising:
   an insulating layer covered on said surface except for said interconnection portions; and
   a retreated concave portion formed at an edge of said insulating layer adjacent to said interconnection portions,
   wherein said retreated concave portion receives conductive particles flown out from said anisotropic conductive film due to the thermocompression bonding.

2. An interconnection structure of conductive wirings for interconnecting a pair of interconnection objects by a thermocompression bonding, in which the conductive wirings are disposed on the interconnection objects, respectively, comprising:
   interconnection portions formed of conductive wiring patterns on a surface of each supporting body of said interconnection objects, said interconnection portions being provided with gaps between adjacent ones;
   an anisotropic conductive film containing conductive particles therein, said film being interposed between said interconnection portions disposed on the respective interconnection objects;
   an accumulating space formed in said respective gaps between said conductive wiring patterns in order to prevent an over-density of said conductive particles flown out from said interconnection portions to said gaps due to said thermocompression bonding from occurring; and
   an insulating layer,
   wherein said insulating layer covers said supporting body of one or both of said interconnection objects except for said interconnection portions, and
   wherein said accumulating space comprises retreated concave portion formed at an edge of said insulating layer adjacent to said interconnections portion.

3. The interconnection structure of conductive wirings according to claim 2, wherein one of said pair of interconnection objects is one a print wiring board and a TAB tape.

4. The interconnection structure of conductive wirings according to claim 2, wherein one of said pair of interconnection objects is an interconnection portion of a display panel board.

5. An organic EL display panel having a substrate, and interconnection portions including conductive wiring patterns formed on the substrate, the interconnection portions being connected with an interconnection object via an anisotropic conductive film by a thermocompression bonding, comprising:
   an insulating layer covering said substrate or said interconnection object except for said interconnection portions and
   an accumulating space comprising a retreated concave portion formed at an edge of said insulating layer adjacent to said interconnection portions.

* * * * *